(12) United States Patent
Bergner et al.

(10) Patent No.: US 6,802,737 B2
(45) Date of Patent: Oct. 12, 2004

(54) MODULAR CONNECTION SYSTEM FOR ETHERNET APPLICATIONS IN THE INDUSTRIAL SECTOR

(75) Inventors: Bert Bergner, Bensheim (DE); Guenter Feldmeier, Lorsch (DE)

(73) Assignee: Tyco Electronics Amp GmbH

( * ) Notice: Subject to any disclaimer, the term of this patent is extended or adjusted under 35 U.S.C. 154(b) by 0 days.

(21) Appl. No.: 10/363,711

(22) PCT Filed: Aug. 31, 2001

(86) PCT No.: PCT/IB01/01588
§ 371 (c)(1),
(2), (4) Date: Jun. 20, 2003

(87) PCT Pub. No.: WO02/23676
PCT Pub. Date: Mar. 21, 2002

(65) Prior Publication Data
US 2004/0033720 A1 Feb. 19, 2004

(30) Foreign Application Priority Data
Sep. 12, 2000 (EP) .......................................... 00119811

(51) Int. Cl.$^7$ .............................................. H01R 13/60
(52) U.S. Cl. ...................... 439/532; 439/76.1; 439/716; 439/928
(58) Field of Search ............................... 439/532, 76.1, 439/716, 928, 94

(56) References Cited
U.S. PATENT DOCUMENTS

| | | | | |
|---|---|---|---|---|
| 5,476,388 A | | 12/1995 | Rutkowski | ................. 439/76.1 |
| 5,629,831 A | * | 5/1997 | Eggert et al. | ................ 439/716 |
| 5,641,313 A | | 6/1997 | Hohorst | ...................... 439/709 |
| 5,716,241 A | * | 2/1998 | Hennemann et al. | ........ 439/716 |
| 5,775,955 A | * | 7/1998 | Graube et al. | ............... 439/717 |
| 5,961,335 A | | 10/1999 | Kubernus et al. | ........... 439/76.1 |
| 6,008,985 A | * | 12/1999 | Lake et al. | .................. 439/928 |
| 6,027,380 A | * | 2/2000 | Hanning et al. | ............. 439/716 |
| 6,418,027 B1 | * | 7/2002 | Suzuki et al. | ................ 361/729 |
| 6,425,770 B1 | * | 7/2002 | Lostoski et al. | ............. 439/716 |
| 6,475,036 B2 | * | 11/2002 | Morikawa | .................... 439/716 |
| 6,575,771 B2 | * | 6/2003 | Schnatwinkel et al. | ...... 439/716 |

FOREIGN PATENT DOCUMENTS

| | | |
|---|---|---|
| EP | 0 917 248 A2 | 5/1999 |
| EP | 0 918 385 A1 | 5/1999 |
| GB | 2 142 736 A | 5/1983 |

* cited by examiner

Primary Examiner—Tho D. Ta

(57) ABSTRACT

The invention relates to a modular connection system for industrial applications having electronic modules which have at least one data distribution device and can be mounted on a mounting rail. The electronic modules have a plurality of connections, which can be contacted via universal module locations, wherein a databus and a power supply connection are located between the electronic modules mounted on the mounting rail. Connection modules are attachable to the module locations of the electronic modules and can be fastened there mechanically to produce an electrical connection between optical or electric cables and the connections.

14 Claims, 4 Drawing Sheets

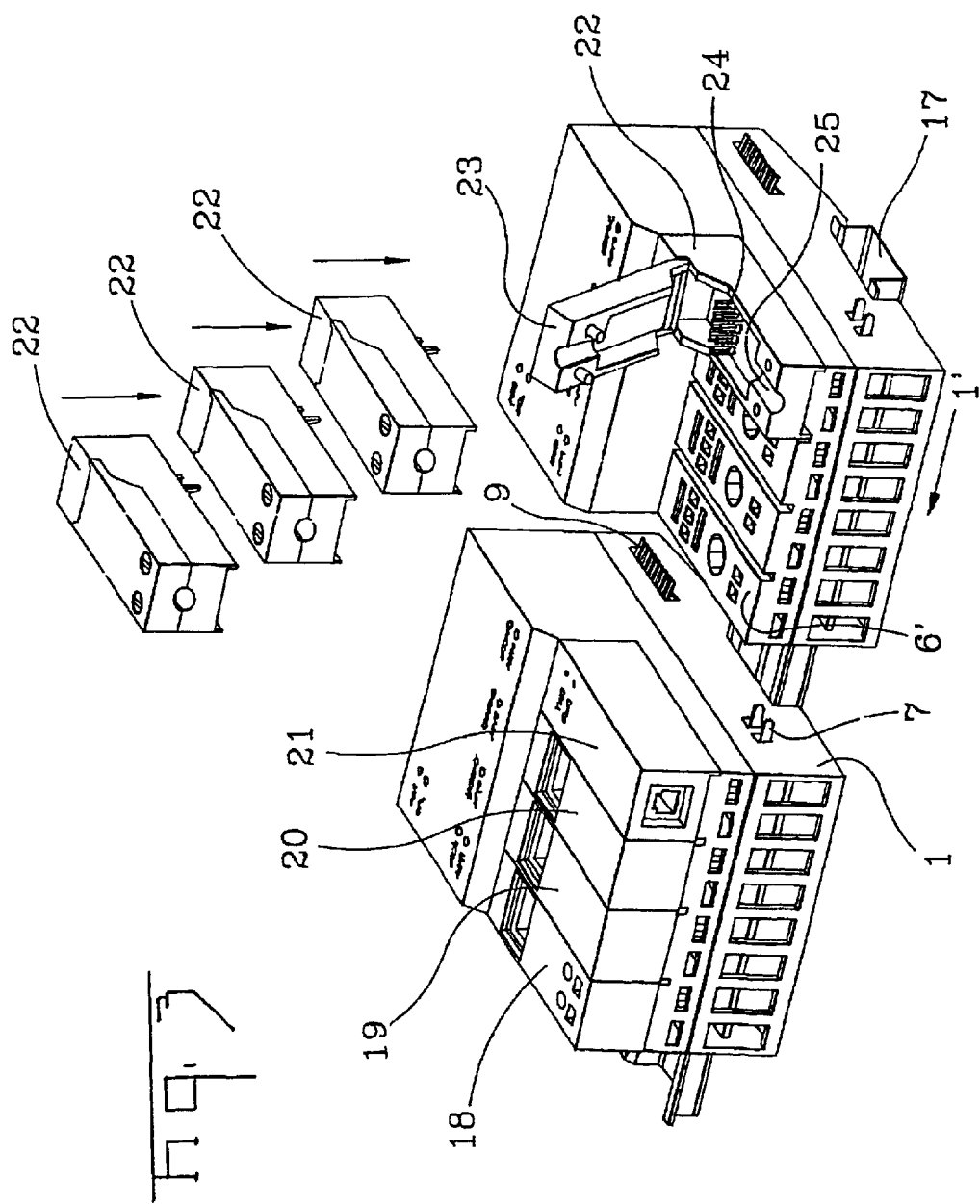

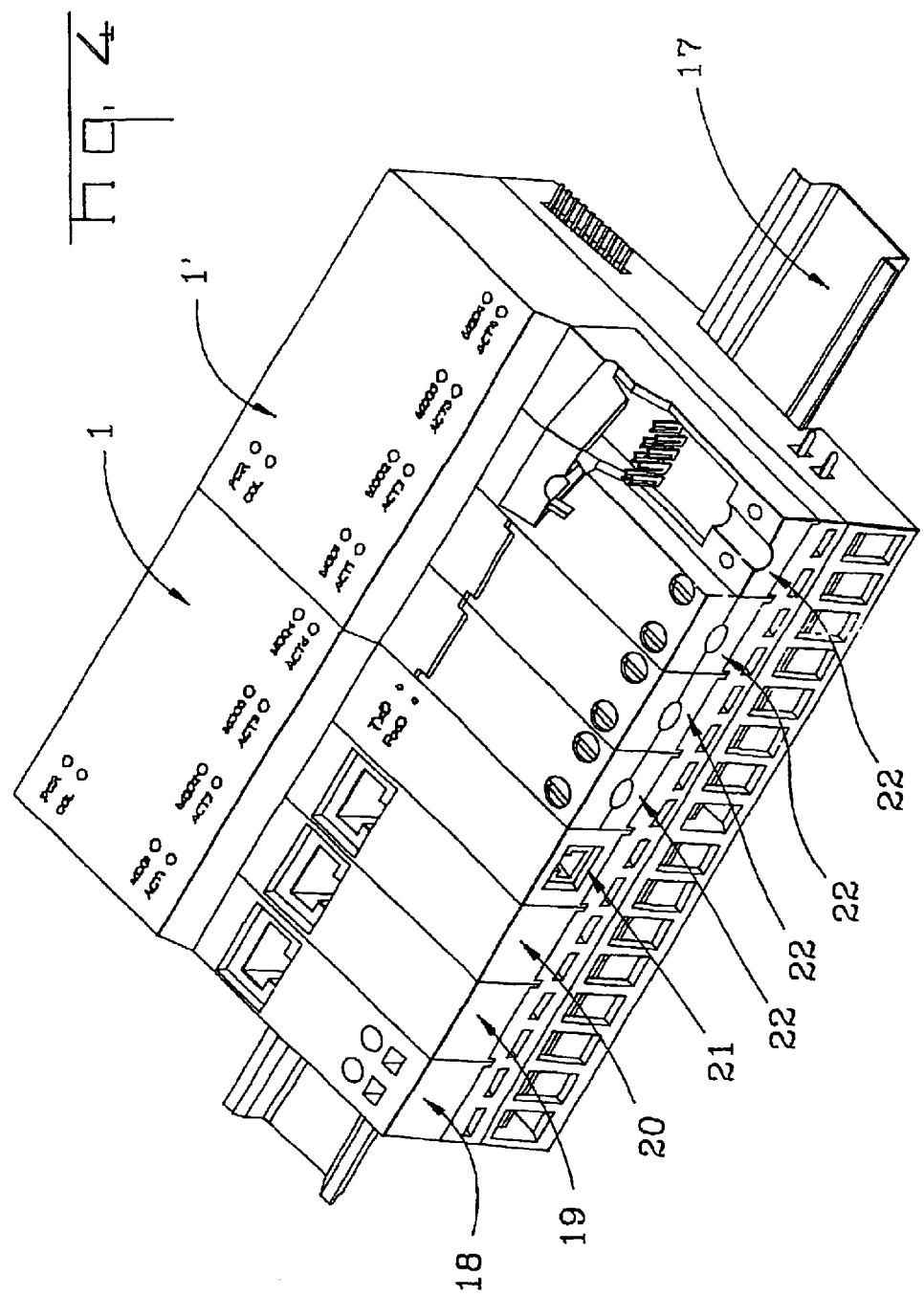

MODULAR CONNECTION SYSTEM FOR ETHERNET APPLICATIONS IN THE INDUSTRIAL SECTOR

FIELD OF THE INVENTION

The invention relates to a modular connection system for Ethernet applications.

BACKGROUND

Known connection systems for Ethernet applications are in part unsuitable for industrial applications. These systems can be modularly configured with respect to the number of ports, can be mounted on a rail and typically have outlets for example RJ45 receptacles for connecting to corresponding plugs. These systems, however often do not meet the electromechanical and flexibility requirements of the industry.

It is an object of the invention to provide a modular connection system for the industrial sector which fulfils the requirements of the industry with respect to electromechanical construction and flexibility.

SUMMARY

This and other objects are achieved by a modular system design for active network components for use in the industrial sector close to production machinery. In contrast to use in the conventional office or building sector, the requirements with respect to electromechanical structure and flexibility are different in the planning of network topology despite identical electrical and logical functioning. In the industrial sector, the network topology has to be adapted to the different production processes. In contrast to the office sector, the number of connection ports per data distribution device or active components like a switch or hub is likely to be smaller.

BRIEF DESCRIPTION OF THE DRAWINGS

An embodiment of the invention will now be described with the aid of the drawings, in which:

FIG. 3 is a perspective view of two electronic modules having a plurality of connection modules attached.

FIG. 4 is a perspective view of a completely assembled modular connection system according to the invention.

DETAILED DESCRIPTION OF THE PREFERRED EMBODIMENT

Figure 1:
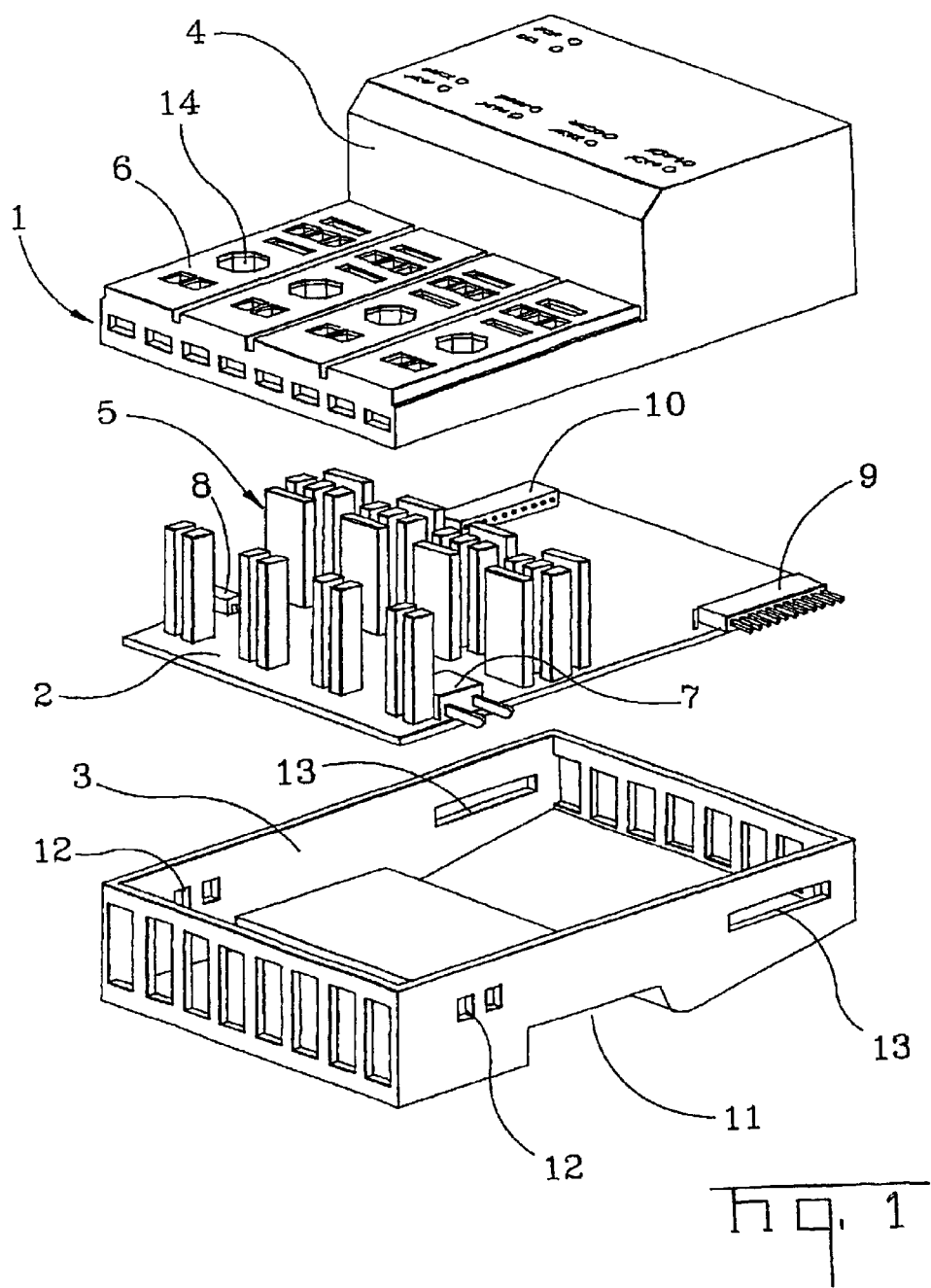
FIG. 1 is a perspective exploded view of an electronic module according to the invention.

The invention will now be described in greater detail referring first to FIG. 1. The electronic module 1 consists of a printed circuit board 2, a lower housing 3 and an upper housing 4. A data distribution device, for example a hub or a switch is located on the printed circuit board 2. A plurality of connections 5, here four connections which are designed as universal module locations 6, are also provided on the printed circuit board 2. The four connections 5 are, in each case, a respective network port which is correspondingly connected to the data distribution device. The printed circuit board 2 has a respective power supply connection 7, 8 on opposing sides and plug connectors 9, 10 for the databus line on opposing sides. The plug connectors 9, 10 are complementary, just as the connectors 7, 8 are complementary. This is the case so that a plurality of electronic modules can be laterally butt mounted and connected to each other. The lower housing 3 has a recess 11 in its bottom. This recess 11 serves to receive a mounting rail such as a top hat rail, on which the electronic module 1 can be mounted. Openings 12, 13 are also provided in the side walls of the lower housing 3. Whereas the openings 12 serve to receive the power supply connections 7, 8, the openings 13 are suitable for receiving the plug connectors 9, 10 for the databus. The upper housing 4 has, in its front region, four universal module locations 6 for each connection 5. In the rear region, it is possible to provide various indicators 15. The universal module locations 6 each have a coded key way 14.

Figure 2:
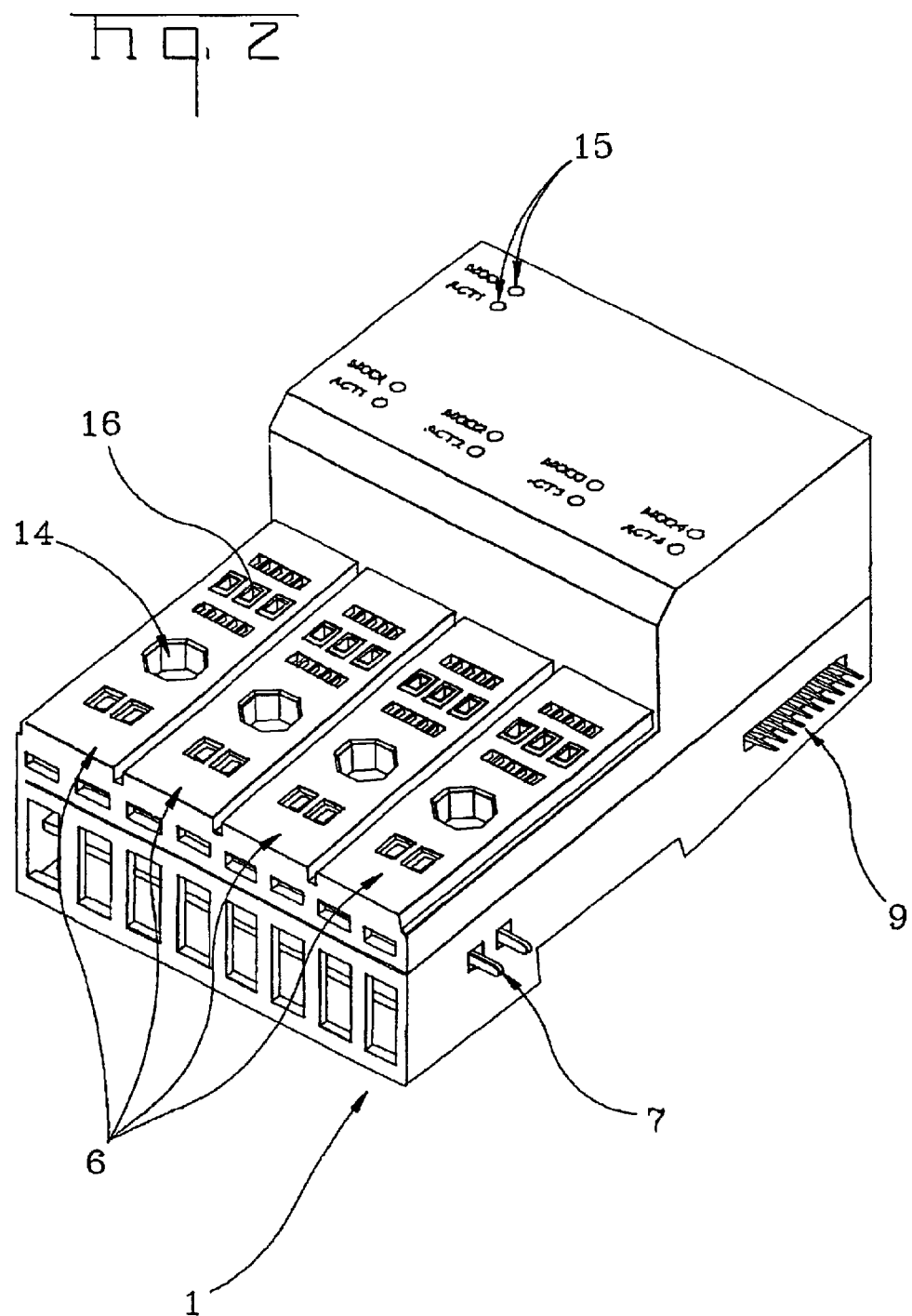
FIG. 2 is a perspective view of the electronic module of FIG. 1.

FIG. 2 shows a fully assembled electronic module 1. The four universal module locations 6 with the coded key way 14 are arranged in the front region of the module 1. The power supply connections 7 and the plug connector for the databus 9 are located on the side of the module 1. In the rear region of the module 1, indicators 15 are provided. The universal module locations 6 of the four connections 5 have a plurality of contacts 16 which are used depending on the design of the connection module.

FIGS. 3 and 4 show two electronic modules 1, 1' butt mounted on a top hat rail 17. They can be moved along the top hat rail to mate databus plug connectors 9 and the power supply connectors 7 on the adjacent modules. As shown in FIG. 3, four connection modules 18, 19, 20, 21 are already latched onto the left electronic module 1 and only one connection module 22 is latched onto the right electronic module 1'. Three further connection modules 22 can still be placed as necessary from above on to the corresponding module locations 6'.

The connection modules 18, 19, 21 differ from one another. The module 21 is an optical module which has an active component for converting the optical signal into an electric signal. The connection modules 18–20 are modules which have a modular jack plug connector and are suitable for receiving an RJ45 plug connector. The module 18 differs from the modules 19 and 20 in that it additionally has a connection for feeding in the supply current.

The modules 22 are identically constructed. They are rapid connection modules which have a flap lid 23 and an insulation displacement contact 24 for contacting the conductor of a cable. A cable strain relief device 25 is also provided. These modules can be designed for the connection of various cables.

Different physical designs of cables can be used, depending on the application, in each case. The system is suitable both for copper and for fiber optic cables depending upon the module selected. A plurality of connection modules may be connected to each electronic module. These connection modules can be attached to the connections of the electronic modules and mechanically fastened there to produce an electrical connection between an optical or any electrical cable.

A plurality of electronic modules can be butt mounted to a system. It is therefore possible, to produce, for example star hubs with optionally 4, 8, 12, etc. connections.

Each electronic module has a universal module location per connection. Depending on the connection module used, it produces a connection to specific contacts of the module location.

It is an advantage for differentiating between the function-specific connection modules to provide a coding of the connections or the module locations, and connection modules.

It is also an advantage to provide the electronic modules with a screen. This can be effected by means of a coated plastic housing, by means of a metal housing or by means of screening plates.

Each electronic module can be contacted by means of a plurality of connection modules. The connection modules here are particularly advantageously capable of latching onto the electric module. The connection modules can be very different in design.

Purely passive connection modules are also possible which have, for example, an RJ45 socket-outlet for receiving a corresponding plug which is connected to the cable. It is also possible to provide connection modules for directly clamping-on installation cables, for example insulation displacement contacts. There can be connection modules of this type for various cable types. An integrated screen cover and a strain relief device can also be provided in the process.

However, active connection modules are also within the scope of the invention. An optical transceiver can be located therein with an MTRJ connection to which an optical fiber can be attached. There can still be alternatives here in that multimode, single mode or also plastic fibres can be attached.

An extension of the modular connection system is possible, for example with special modules. It is advantageous that the power supply can be butt mounted to the electronic modules in a special module.

It is also advantageous to provide special modules with components with diagnostic functions or network management functions. Butt mountable special modules such as ISDN routers, couplers to other networks and so on can also be provided.

It is also advantageous to provide special connection modules, such as media converters to special transmission media.

What is claimed is:

1. Modular connection system for Ethernet applications in the industrial sector comprising:

two or more electronic modules each being mountable on a mounting rail and having at least one data distribution device, each electronic module being electrically connectable to an adjacent electronic module on the mounting rail by a databus and a power supply connection to from a continuous databus and powerbus, each electronic module having a plurality of connections, in electrical communication with the data distribution device and forming a plurality of universal connection module location, and a plurality of connection modules being mechanically fastenable to the plurality of connections at the plurality of universal connection module locations, at least one connection module configured to connect an optical or electric cable to the continuous databus.

2. Modular connection system according to claim 1, wherein the data distribution device of at least one of the electronic modules comprises a star hub.

3. Modular connection system according to claim 1, wherein at least one of the electronic modules comprises a selective data distribution switch.

4. Modular connection system according to claim 1, wherein further comprising at least one of diagnostic and network management components.

5. Modular connection system according to claim 1, wherein the connections and the connection modules have a coding key.

6. Modular connection system according to claim 1, wherein the connection module has a screen.

7. Modular connection system according to claim 1, wherein at least one connection module has a socket for an RJ45 plug connector.

8. Modular connection system according to claim 1, wherein at least one connection module has insulation displacement contacts for the rapid contacting of a cable to the continuous databus.

9. Modular connection system according to claim 1, wherein at least one connection module is configured to be connected to an optical cable.

10. Modular connection system according to claim 1, wherein each connection has precisely one universal module location.

11. Modular connection system according to claim 1, further comprising a special module having at least one electronic component and configured to be mounted on the mounting rail and butt connected to the data connector and power connector of one of the electronic modules.

12. Modular connection system according to claim 11, wherein the special module is a power supply for the modules.

13. Modular connection system according to claim 11, wherein the special module comprises diagnostics components.

14. Modular connection system according to claim 11, wherein the special module comprises network management components.

* * * * *